US012791588B2

(12) United States Patent
Scherer et al.

(10) Patent No.: US 12,791,588 B2
(45) Date of Patent: Nov. 10, 2026

(54) CURRENT AND POWER SENSOR FOR MULTI-WIRE CABLES

(71) Applicants: California Institute of Technology, Pasadena, CA (US); TotalEnergies OneTech, Courbevoie (FR)

(72) Inventors: Axel Scherer, Barnard, VT (US); John Richard Ordonez-Varela, Lescar (FR); Samson Chen, Pasadena, CA (US); Pasha Reshetikhin, Pasadena, CA (US)

(73) Assignees: California Institute of Technology, Pasadena, CA (US); TOTALENERGIES ONETECH, Courbevoie (FR)

( * ) Notice: Subject to any disclaimer, the term of this patent is extended or adjusted under 35 U.S.C. 154(b) by 80 days.

(21) Appl. No.: 18/377,547

(22) Filed: Oct. 6, 2023

(65) Prior Publication Data

US 2024/0125819 A1 Apr. 18, 2024

Related U.S. Application Data

(60) Provisional application No. 63/413,751, filed on Oct. 6, 2022.

(51) Int. Cl.
*G01R 15/20* (2006.01)
*G01R 21/06* (2006.01)

(52) U.S. Cl.
CPC ............. *G01R 15/20* (2013.01); *G01R 21/06* (2013.01)

(58) Field of Classification Search
CPC ...... G01R 15/12; G01R 15/14; G01R 15/148; G01R 15/18; G01R 15/20–207;
(Continued)

(56) References Cited

U.S. PATENT DOCUMENTS 5,473,244 A * 12/1995 Libove ................. G01R 15/142 324/130
2007/0063691 A1* 3/2007 Yakymyshyn ....... G01R 15/207 324/117 R (Continued)

FOREIGN PATENT DOCUMENTS

EP 2776853 10/2016
WO WO-2020168379 A1 * 8/2020 ............. G01R 21/06

OTHER PUBLICATIONS

A. B. Reid et al., "Magnetic interpretation in three dimensions using Euler deconvolution", Geophysics, vol. 55 No. 1 (Jan. 1990) (Year: 1990).*

(Continued)

*Primary Examiner* — Lee E Rodak
*Assistant Examiner* — Jeremiah J Barron
(74) *Attorney, Agent, or Firm* — Kaplan Breyer Schwarz LLP

(57) ABSTRACT

The present disclosure is directed toward systems and methods for measuring electric current in a multi-wire cable, as well as the apparent and real power associated with an electrical load connected to the cable. A probe comprising an array of small form-factor, high-speed magnetometers is operatively coupled with the cable such that the magnetometers partially surround the cable. Each magnetometer detects the composite magnetic field at its location, and this plurality of measurements is used to generate a magnetic-field map. The contributions of the current flow in each wire are identified by deconvolving the magnetic-field map, enabling their locations to be determined and monitoring of the current and power flow. A sensor included in the probe is used to determine the phase of the applied voltage. The phase difference between the voltage and current is then used to determine the real power dissipation of the load.

15 Claims, 5 Drawing Sheets

(58) Field of Classification Search
CPC ...... G01R 19/06; G01R 19/14; G01R 19/145; G01R 19/15; G01R 21/06; G01R 21/08; G01R 11/06
See application file for complete search history.

(56) References Cited

U.S. PATENT DOCUMENTS

| | | | | |
|---|---|---|---|---|
| 2009/0006015 | A1* | 1/2009 | Mueller | G01R 15/20 702/65 |
| 2011/0084688 | A1 | 4/2011 | Sorensen | |
| 2012/0253726 | A1* | 10/2012 | Xu | G01R 35/005 702/104 |
| 2013/0229192 | A1* | 9/2013 | Behringer | G01R 11/02 324/658 |
| 2014/0218018 | A1 | 8/2014 | Ivanov et al. | |
| 2014/0266177 | A1 | 9/2014 | Wisniewski et al. | |
| 2018/0003777 | A1* | 1/2018 | Sorensen | G01R 35/00 |
| 2019/0079122 | A1 | 3/2019 | Losinno et al. | |
| 2019/0146009 | A1 | 5/2019 | Blanchard, III et al. | |
| 2020/0191834 | A1 | 6/2020 | Bilbao De Mendizabal | |
| 2022/0049977 | A1 | 2/2022 | Claytor et al. | |
| 2022/0082590 | A1 | 3/2022 | Steuer et al. | |
| 2023/0358793 | A1* | 11/2023 | Meyer | G01R 21/08 |

OTHER PUBLICATIONS

Authorized Officer Kari Rodriguez, International Search Report and Written Opinion issued in PCT Patent Application No. PCT/US2023/034682 on Feb. 8, 2024.
Extended European Search Report issued in EP Patent Application No. 23875567.2 on Jul. 30, 2026.

* cited by examiner

200

CURRENT AND POWER SENSOR FOR MULTI-WIRE CABLES

CROSS-REFERENCE TO RELATED APPLICATIONS

This application claims the benefit of U.S. Provisional Application No. 63/413,751, filed Oct. 6, 2022, which is incorporated herein by reference in its entirety.

FIELD OF THE INVENTION

The present invention relates to power measurement in electrical power systems.

BACKGROUND OF THE INVENTION

There has long been a need to measure AC electrical power delivered to devices, such as household appliances. For example, intelligent use of electrical equipment relies on continuous information about its power consumption, which minimally requires knowledge of its electric-current usage. There are two practical measurements of power—apparent, and real, and in most applications, both parameters are critical. Determination of both parameters further requires knowledge of the phase of that electric current usage with respect to the voltage applied to the device.

Historically, measurement of AC current flow through a wire has been done by measuring a related parameter, such as induced magnetic field. As electric current flows through a wire, it produces a magnetic field whose strength is a function of distance from the wire. A conventional device, such as "clamp-type" electric-current meters based on a Rogowski coil, current-transformer coil, or Hall-effect sensor, generates an electrical signal whose magnitude depends on the magnetic field it experiences. When clamped around the wire, the generated electrical signal provides an indication of the magnitude of current flow within the wire.

Unfortunately, these devices cannot measure currents going through different conductors in multi-pole cables. In the case of multi-pole cables containing both active and return conductors, the net magnetic field is zero due to magnetic fields from opposing currents canceling each other out, making any measurement of power consumption impossible. These types of cables are common in some types of in-wall wiring and most ordinary power cables, such as those connected to space heaters, air conditioning systems, computer power supplies, and the like.

Electrical power in an AC electrical system can be described by multiple components. The two most relevant parameters are real power and apparent power. Only apparent power is measurable when exclusively measuring the current through wires in a cable. Apparent power primarily relates to the load that a device may place on an electrical distribution system (e.g. wire gauge, circuit breakers, transformer sizing), but does not relate to the amount of physical energy that is used by a device. "Real power" relates to the real amount of power that a device uses (e.g. amount of power needed to be produced by a power plant), and is how most electrical customers are directly billed for their energy usage.

Unfortunately, prior-art current measurement devices that can measure both real and apparent power are bulky and require disconnection of existing appliances to install. This may be impossible for certain appliances which may be hardwired, difficult to reach, or have insufficient space for installation.

Systems and methods for accurately and easily measuring current flow and/or power consumption in single-wire or multi-wire electrical cables along with both real and apparent power would be a significant advance in the state of the art.

SUMMARY

An advance is made in the art according to aspects of the present disclosure directed to measuring electrical parameters, such as AC electric current, real power, apparent power, power factor and/or reactive power being delivered through a cable. Embodiments in accordance with the present disclosure are particularly well suited for measuring such parameters in single-wire cables, multi-wire cables, high-voltage power lines, three-phase power cables, and the like.

An advance over the prior art is realized by employing a probe having an array of small form-factor, high-speed magnetometers to sample a composite magnetic field around a multi-wire cable, which arises due to current flow in each of the wires. By oversampling the composite magnetic field with the magnetometer array, the contributions to the composite magnetic field by the current flow in each wire can be deconvolved with high accuracy to determine the locations of each wire. This information can then be used to derive the current flow in each wire, thereby enabling determination of the apparent power delivered to the connected equipment. Because the magnetometers are high-frequency, they can perform time-resolved measurements of the magnetic field at a significantly higher frequency than the typical 50 Hz or 60 Hz frequency of typical AC electrical signals, thereby enabling accurate determination of the phase of the current flow in the wires.

Furthermore, this high-frequency measurement capability of the magnetometers enables a probe in accordance with the present disclosure to temporally oversample current flow in a cable, thereby providing highly accurate time-resolved measurements of the current flow, even when it is non-sinusoidal and/or includes frequency components (e.g., due to harmonics, noise, etc.) at frequencies significantly higher than the line frequency of a typical AC power-distribution system.

Furthermore, some probes in accordance with the present disclosure are configured to detect an electric field that is representative of the voltage applied to a cable. By monitoring the frequency ripple in the electric field from particular conductors, the phase of the applied voltage can be determined. The phase difference between the applied voltage and the AC current flow can then be used to determine the real and apparent power dissipation of an electrical load attached to the cable.

Some probes may also determine the real and apparent power dissipation of an electrical load attached to the cable by wirelessly synchronizing voltage phase data from another device. This may be necessary if, for example, the cable connected to the device is shielded. This other device may be a wired base station connected to an outlet, or another probe attached to another cable. Because the phase of the voltage applied to a single location or household are typically the same, voltage data may be acquired from another nearby device.

An illustrative embodiment is a probe comprising a magnetometer array and electric-field sensor that are in communication with a processor. The magnetometer array and sensor are disposed on a panel that includes a port for receiving a multi-wire cable and securing the probe and cable in a fixed arrangement that locates the cable such that it is partially surrounded by the magnetometer array.

Each magnetometer of the array is a small form-factor, high-speed three-axis magnetometer. In particular, each magnetometer can require as little as 1 $mm^2$ of real estate on the panel; therefore, the magnetometers can be located very close to one another. In addition, each magnetometer has a frequency response that is substantially higher than the 60 Hz frequency of typical AC electrical signals. In the illustrative embodiment, each magnetometer of the array has a 1 kHz frequency response.

In operation, the dense magnetometer array oversamples a composite magnetic field that arises due to current flow through the wires of the cable. The output signals of the magnetometers are used to generate a magnetic-field map that is then deconvolved to identify the contributions to it made by the current flow in each wire of the cable, which are used to identify the location of each wire.

Once the wire locations are known a subset of the magnetometers is used to make time-resolved measurements of the current flow, the relative phases of the current flow in the conductors is determined—in some embodiments, using only a small subset of the magnetometers of the array. Subsequently, at least one of the apparent power and real power being delivered equipment attached to the cable can be determined, as well as power factor and/or reactive power.

The electric-field sensor is configured to determine the voltages applied to individual conductors in the cable. The sensor comprises a plurality of electrodes that are configured to electrostatically couple to the AC voltages applied to the conductors inside the cable. The phase offset of the voltages are then used to determine the real power being delivered to equipment attached to the cable. In some embodiments, the sensor includes a single electrode, such as a wire. In some embodiments, the sensor includes an antenna, such as a dipole antenna, monopole antenna, whip antenna, loop antenna, and the like.

An embodiment in accordance with the present disclosure is a probe (100) for measuring at least one of electric current and power in a cable (114) that includes a plurality of wires (W1 to W3), the probe comprising: a magnetometer array (102) disposed on a panel, the magnetometer array comprising a plurality of magnetometers (MG-1 to MG-10), each magnetometer of the plurality thereof having a frequency response that is equal to or greater than 100 Hz; and the panel (108), wherein the panel includes a port (116) configured to locate the cable relative to the magnetometer array; wherein the magnetometer array is arranged about the port such that, when the probe and cable are operatively coupled via the port, the magnetometer array partially surrounds the cable; and wherein each magnetometer of the plurality thereof is configured to provide an output signal (112-1 to 112-10) to a processor (110), the output signal being indicative of the magnetic field strength at its respective magnetometer.

Another embodiment in accordance with the present disclosure is a method for measuring at least one of electric current and power in a cable (114) that includes a plurality of wires (W1 to W3), the method comprising: operatively coupling a probe (100) and the cable, wherein the probe includes a magnetometer array (102) disposed on a panel (108), the magnetometer array comprising a plurality of magnetometers (MG-1 through MG-10) characterized by a frequency response that is equal to or greater than 100 Hz, and wherein probe and cable are arranged such that the magnetometer array partially surrounds the cable; providing an output signal (112-1 to 112-10) from each magnetometer of the plurality thereof to a processor (110), wherein the output signal of each magnetometer is indicative of the magnetic field strength at that magnetometer; creating a magnetic-field map (400) based on the plurality of output signals; and identifying the location (L1) of at least one wire (W1) of the plurality thereof based on the magnetic-field map.

DETAILED DESCRIPTION

Figure 1:
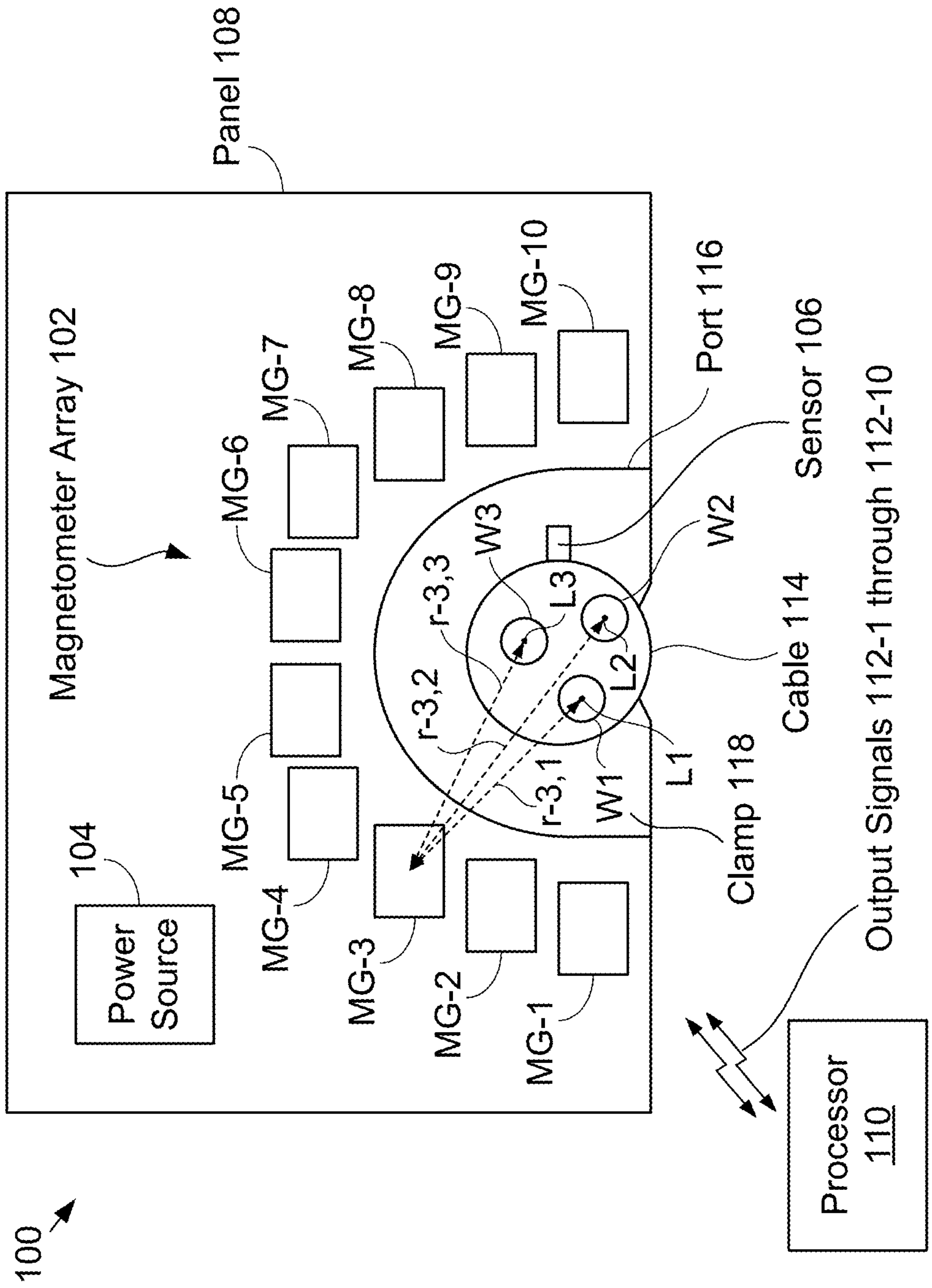
FIG. 1 depicts a schematic drawing of a cross-sectional view of an illustrative embodiment of a probe for measuring electrical current and/or power in accordance with the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The functions of the various elements shown in the Drawing, including any functional blocks that may be labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included. Still further, a processor, as used herein, can be located within a single subsystem or include multiple components distributed among different subsystems.

Software modules, or simply modules, which are implied to be software, may be represented herein as any combination of flowchart elements or other elements indicating performance of process steps and/or textual description. Such modules may be executed by hardware that is expressly or implicitly shown.

Unless otherwise explicitly specified herein, the figures comprising the drawing are not drawn to scale.

FIG. 1 depicts a schematic drawing of a cross-sectional view of an illustrative embodiment of a probe for measuring electrical current and/or power in accordance with the present disclosure. Probe 100 includes magnetometer array 102, power source 104, and sensor 106, and panel 108.

Magnetometer array 102 includes magnetometers MG-1 through MG-10, which are disposed on panel 108. Each of magnetometers MG-1 through MG-10 is a conventional high-speed magnetic-field sensor having a frequency response sufficient to enable measurement of the strength of a magnetic field at a rate significantly greater than 60 Hz (preferably on the order of 1 kHz or more) and providing a commensurate output signal. Magnetometers MG-1 through MG-10 provide output signals 112-1 through 112-10, respectively. In the depicted example, each of magnetometers MG-1 through MG-10 (referred to, collectively, as magnetometers MG) is a small form-factor (<1 mm per side) three-axis magnetic-field sensor capable of measuring magnetic-field strengths up to ±30 Gauss with a frequency response of 1 kHz; however, any miniature magnetometer capable of high-speed measurements (e.g., frequency response 100 Hz) can be used without departing from the scope of the present disclosure. Although the depicted example includes magnetometers having a footprint that is <1 $mm^2$ on panel 108, in some embodiments, one or more magnetometers of magnetometer array 102 have a larger footprint on the panel. For example, in some embodiments at least one magnetometer has a footprint of several square millimeters (e.g., 2 $mm^2$, 3 $mm^2$, 5 $mm^2$, 16 $mm^2$, etc.). It should be noted that any practical size magnetometers can be used in magnetometer array 102 as long as they collectively provide spatial resolution sufficient to differentiate the locations of the wires in cable 114, as discussed in more detail below.

As discussed in more detail below, the use of small form-factor, high-speed miniature magnetometers for magnetometers MG affords embodiments in accordance with the present disclosure significant advantages over prior art electric-current and power-sensing devices—particularly when used to analyze multi-wire cables. For example, magnetometers having a small footprint (preferably ≤1 $mm^2$) on panel 108 can be arranged in a dense array around port 116 such that the magnetometer array partially surrounds cable 114 when the cable is held in port 116. This enables magnetometers MG to collectively measure the composite magnetic field generated by the current flow with a spatial resolution that enables distinction between the magnetic field generated by each wire within a multi-wire cable. This, in turn, enables the determination of the locations of each individual wire. In addition, high-speed measurements (at a rate at least twice the frequency of the signal being measured) enable time-resolved measurements of the current flow within each wire, which further enables determination of the phase of each current flow. High-speed measurements also assist in accurately determining power consumption for some attached devices which produce high frequency harmonics. Furthermore, when coupled with knowledge of the applied voltage, the real power associated with each wire can be determined. Still further, small form-factor magnetometers also typically require lower power during operation, which can enable a small form-factor probe whose power dissipation is low enough to enable battery-powered, wireless operation.

Magnetometers suitable for use in accordance with the present disclosure include, without limitation, magnetic sensors, Hall-effect sensors, magneto-resistive sensors, and the like, any of which can be a single- or multi-axis device. Furthermore, although the depicted example includes a magnetometer array having ten magnetometers, in some embodiments, a different number of magnetometers is included in magnetometer array 102. In some embodiments, a current/power probe includes only one magnetometer.

Power source 104 is a conventional energy-storage device that is operative for providing power to magnetometers MG and other electronic devices disposed on panel 108 (not shown). Power sources suitable for use in accordance with the present disclosure include, without limitation, batteries, supercapacitors, solar cells, energy-scavenging devices, and the like.

Sensor 106 is an electric-field sensor that includes a plurality of electrodes configured to electrostatically couple to the AC voltages applied to the conductors inside the cable bundle. In the depicted example, sensor 106 includes a plurality of electrodes that are disposed on the outer surface (i.e., jacket) of cable 114.

In some embodiments, sensor 106 includes a simple wire that functions as an electrode configured to sense an electric field that is proportional to the voltage applied to cable 114. In some embodiments, sensor 106 includes a conventional antenna operative for sensing the electric field, such as a monopole antenna, dipole antenna, and the like.

Panel 108 is a structurally rigid platform suitable for holding power source 104 and magnetometers MG and enabling electrical connection between them, as well as between other electronics mounted on the panel (not shown). In the depicted example, panel 108 is a conventional multilayer printed circuit board; however, any suitable panel material can be used. Suitable panel materials include, without limitation, semiconductors, laminates, glasses, ceramics, composites, alumina, and the like.

Processor 110 is a conventional processor that is in communication with magnetometer array 102 over a conventional communications link that can be hardwired or wireless.

Processor 110 receives signals, such as output signals 112-1 through 112-10 (referred to, collectively, as output signals 112), from probe 100, stores data, executes program instructions, performs analysis of the output signals, and the like. In the depicted example, processor 110 is operative for performing analysis of the output signals, generating a map of at least a portion of the magnetic field surrounding cable 114, performing deconvolutions to identify the locations of each of wires W1 through W3, and estimating an electrical parameter (e.g., electric current, real power, apparent power, etc.) for at least one of wires W1 through W3.

In some embodiments, processor 110 includes a microprocessor disposed on panel 108. In some embodiments, processor 110 is a stand-alone processor (e.g., a personal computer, cellphone, wireless terminal, etc.) that is in communication with probe 100. In some embodiments, processor 110 includes devices/systems that are distributed among multiple units.

It should be noted that, although cable 114 is depicted as including three wires, embodiments in accordance with the present disclosure can be used to sense the current flow and/or power in a system connected to a cable having any practical number of wires.

Figure 2:
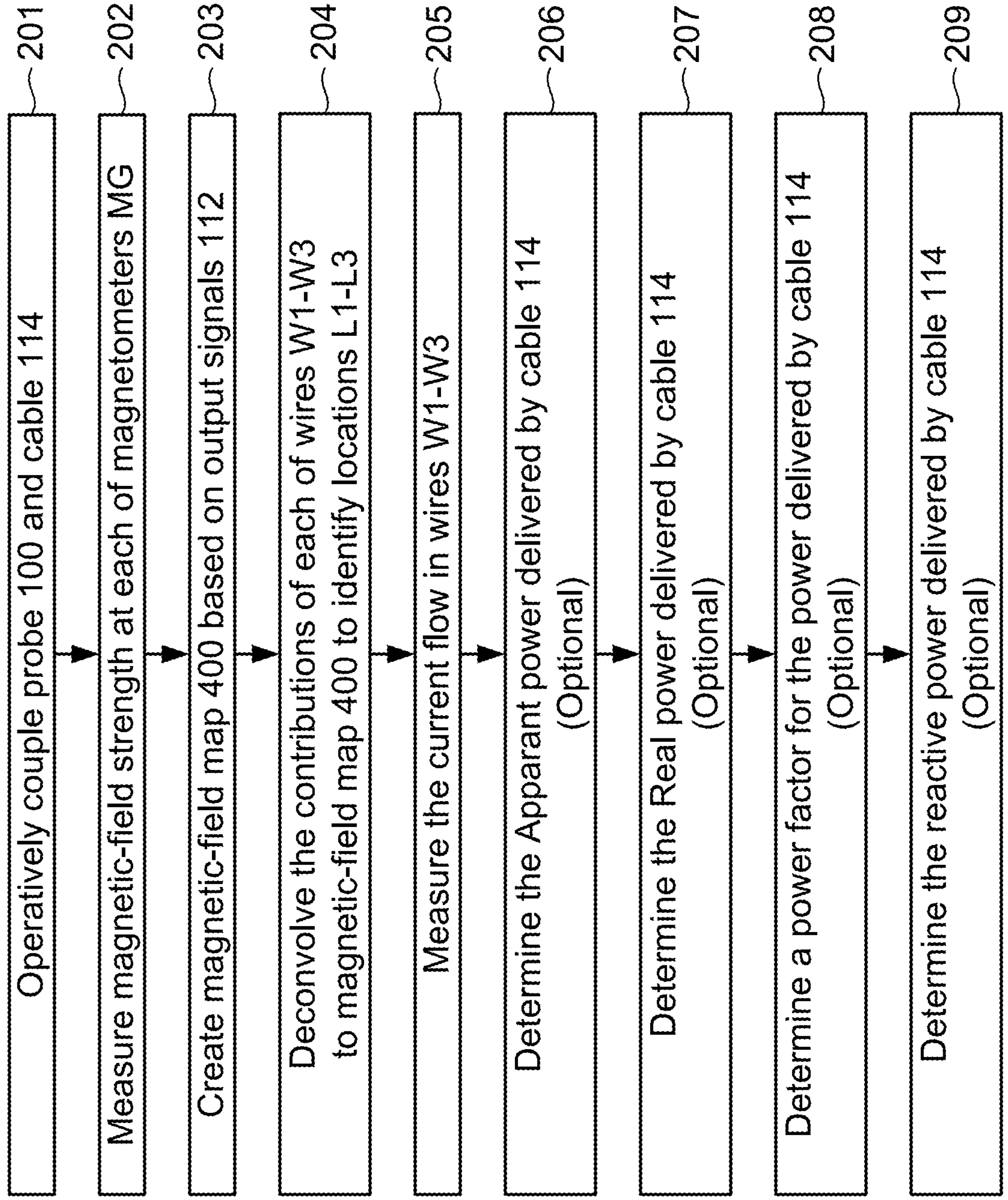
FIG. 2 depicts operations of a method for measuring electric current, real power, and apparent power in the wires of a multi-wire cable in accordance with the present disclosure.

FIG. 2 depicts operations of a method for measuring electric current, apparent power, and real power delivered through the wires of a multi-wire cable in accordance with the present disclosure. Method 200 is described with continuing reference to FIG. 1, as well as reference to FIGS. 3-5. Method 200 begins with operation 201, wherein probe 100 is operatively coupled with cable 114.

Probe 100 is positioned such that cable 114 is secured within port 116 and magnetometers MG are arranged about at least a portion of the cable. Port 116 is an opening in the panel that enables magnetometers MG to partially surround cable 114, thereby enabling them to sense magnetic fields arising from current flow in wires W1 through W3.

Typically, probe 100 is temporarily secured to cable 114 such that the probe and cable remain in a fixed relationship with one another during a measurement period. In the depicted example, port 116 includes clamp 118 for securing cable 114 to probe 100, where clamp 118 is a resilient member into which cable 114 can be inserted and held in a substantially immovable position. In some embodiments, probe 100 includes a different fixture, such as a fastener, latch, and the like, for securing the probe to the cable. In some embodiments, probe 100 does not include a fastener for securing cable 114.

In the depicted example, cable 114 is held within probe 100 such that two sensing axes (e.g., the x- and y-axes) of each magnetometer are substantially orthogonal to the longitudinal axis of cable 114, thereby enabling generation of a vector in the x-y plane based on the magnetic field at the location of that magnetometer. The third sensing axis of each magnetometer (e.g., its z-axis) is substantially parallel to that longitudinal axis; therefore, its output remains substantially constant over time. As a result, the third sensing axis signal is typically not used.

As will be appreciated by one skilled in the art, the strength of a magnetic field, B, arising from current flow, I, through a conductor is a function of distance, r, from that conductor and is given by:

$$B = \frac{\mu I}{2\pi r'} \quad (1)$$

where μ is the magnetic permeability of the medium between each wire/magnetometer pair (assumed to be approximately equal to $4\pi\times10^{-7}$ H/m for most materials).

The composite magnetic field sensed by each of magnetometers MG-1 through MG-10 includes contributions arising from the current flow in each of wires W1 through W3, where each contribution is a function of (1) the distance between that magnetometer and the respective wire and (2) the current flow through that wire, as indicated in equation (1). For example, the composite magnetic field sensed by magnetometer MG-3 includes a first contribution based on distance r-3,1 and the current flow in wire W1, a second contribution based on distance r-3,2 and the current flow in wire W2, and a third contribution based on distance r-3,3 and the current flow in wire W3.

Figure 3:
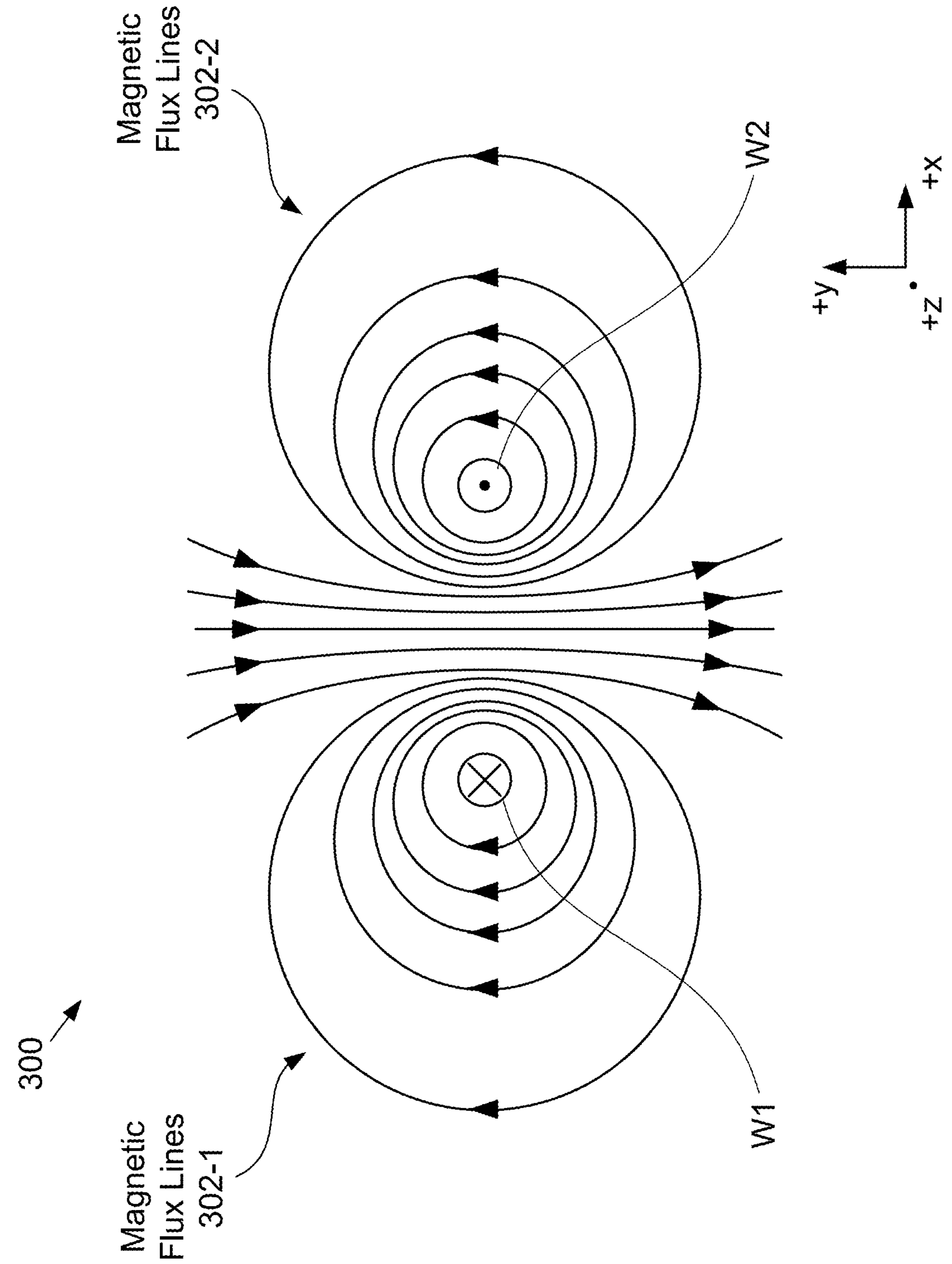
FIG. 3 depicts a schematic drawing of an exemplary composite magnetic field arising from current flow in two wires of cable 114.

FIG. 3 depicts a schematic drawing of an exemplary composite magnetic field arising from current flow in two wires of cable 114.

Magnetic field 300 includes magnetic flux lines 302-1 and 302-2, which arise from the current flow in wires W1 and W1, respectively. As indicated, the current flow in wire W1 is in the negative z-direction (i.e., into the page), while the current flow in wire W2 is in the positive z-direction (i.e., out of the page).

The magnetic flux lines about wire W1 flow in a clockwise direction, while the magnetic flux lines about wire W2 flow in a counter-clockwise direction. In the areas outside the region of the wires, the composite magnetic field is dominated by the magnetic flux contributed by the closer wire. In the region between the wires, however, the magnetic flux of the two wires both contribute to the composite magnetic field, giving rise to a strong magnetic field that flows in the negative y-direction.

At operation 202, magnetometers MG-1 through MG-10 generate output signals 112-1 through 112-10, (i.e., output signals 112), where each output signal includes an x-axis and y-axis component.

At operation 203, processor 110 generates a magnetic-field map based on output signals 112.

Figure 4:
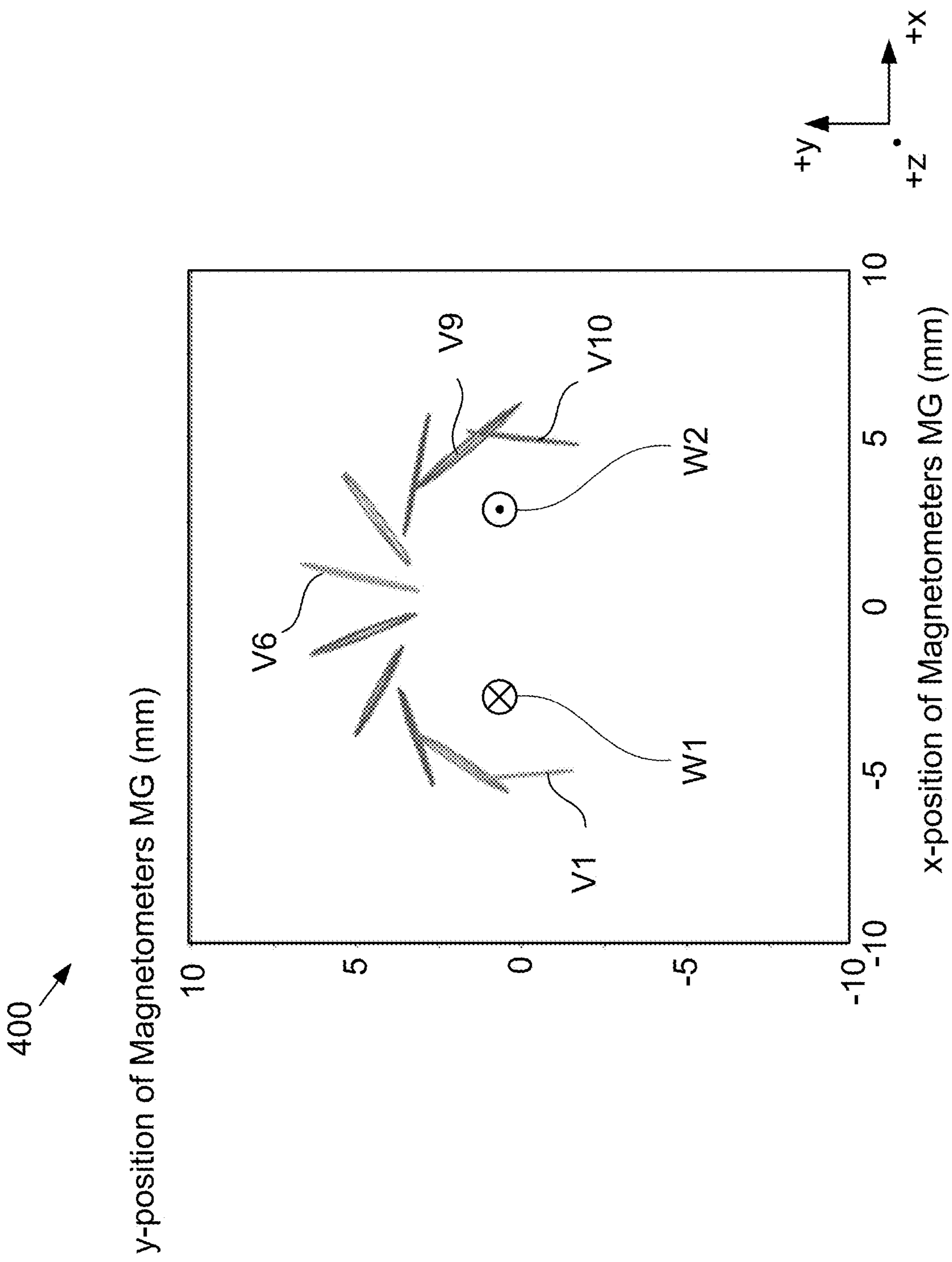
FIG. 4 depicts a schematic drawing of a magnetic-field map in accordance with the present disclosure.

FIG. 4 depicts a schematic drawing of a magnetic-field map in accordance with the present disclosure. Map 400 shows the measured magnetic field sensed by each of magnetometers MG with cable 114 being substantially centered in the magnetometer array. Magnetic-field map 400 includes vectors V1 through V10, which are based on the x-axis and y-axis components of output signals 112-1 through 112-10, respectively.

The orientation of each of vectors V1 through V10 remains fixed in the x-y plane as the current flow in wires W1 through W3 changes at 60 Hz, since wires W1 through W3 are substantially stationary with respect to probe 100. However, the magnitude of each vector oscillates between maximum and minimum values as the current flow changes in the wires.

At operation 204, the contributions of the current flow in each of wires W1 through W3 to composite magnetic field 400 are deconvolved to determine locations L1 through L3. It is an aspect of the present disclosure that, because magnetometers MG-1 through MG-10 are very small, magnetometer array 102 can include a sufficient number of magnetometers to enable the composite magnetic field to be significantly oversampled. As a result, the contribution of each wire can be deconvolved very accurately.

In the depicted example, deconvolution is performed based on changes in the vector magnitudes monitored over a sample period. In some embodiments, the deconvolution is performed based on a series of magnetic-field maps generated by simultaneously sampling output signals 112 at a plurality of discrete times.

At operation 205, a time-resolved measurement of the current flow in wires W1 through W3 is performed by magnetometer array 102.

It should be noted that, once wire locations L1 through L3 are known, the current flow in each wire, and its phase, can be measured using as few as one magnetometer, thereby enabling significant energy savings by turning off some, or nearly all, of the magnetometers of the array. Typically, however, it is preferable to measure the current flows using three magnetometers that are widely spaced apart within magnetometer array 102, such as, for example, magnetometers MG-1, MG-5, and MG-9.

In some cases, the electrical equipment to which cable 114 is attached is a nonlinear electrical load, such as a switching power supplies, thyristors, and digital circuitry, and the like, which can give rise to non-sinusoidal current flow in the wires of the cable. Such non-sinusoidal current flows generally contain frequency components, such as harmonics and noise, which are characterized by a maximum frequency-of-interest that is significantly higher than the 50 Hz or 60 Hz frequency of a typical AC distribution system. In many applications, this maximum frequency-of-interest is typically a multiple of a harmonic, e.g. "$3^{rd}$ harmonic." Generally speaking, the larger the harmonic multiple, the more accurately the non-sinusoidal current flows can be measured. High-end AC electrical measurement equipment can frequently accurately measure up to the $25^{th}$ to $50^{th}$ harmonic, which corresponds to a sampling-rate requirement of 3 kHz to 6 kHz on a 60 Hz AC distribution system. More common measurement equipment may be considerably less capable, measuring as low as the $5^{th}$ harmonic or lower, corresponding to a 600 Hz on a 60 Hz distribution system. As such, it is generally beneficial to use magnetometers whose frequency response enables the sampling frequency to be as high as possible; however, in some embodiments, a compromise sampling frequency is selected to, for example, reduce power consumption for a battery powered probe.

In some embodiments, therefore, the magnetometer(s) of magnetometer array 102 used to sense current flow in these wires are configured to operate with a frequency response sufficient to temporally oversample these higher-frequency components. As a result, preferably, at least one magnetometer of magnetometer array 102 has a frequency response that is equal to or greater than twice the maximum frequency-of-interest of the current flow in wires W1-W3.

It should be further noted that, in some cases, the position of probe 100 can shift relative to cable 114. In such instances, operations 201 through 204 can be repeated to identify the new locations of the wires relative to magnetometer array 102.

In some embodiments, probe 100 includes one or more additional sensors (e.g., accelerometers, inertial sensors, etc.) for sensing motion of the probe that might require operations 201 through 204 to be repeated.

At optional operation 206, the Apparent power delivered by cable 114 is determined.

As will be apparent to one skilled in the art, knowledge of the Apparent power delivered by cable 114 to an AC-powered device is desirable because it can be used to determine the load that the device imparts on the electrical-distribution infrastructure. For example, Apparent power is typically used to determine the size requirements of backup power supplies, electrical wiring, circuit breakers, and transformers.

Determination of Apparent power requires values for both the root-mean-square (RMS) current, $I_{rms}$, in at least one of wires W1-W3 and the RMS voltage, $V_{RMS}$, applied between the wires of cable 114.

In the depicted example, $I_{rms}$ is determined via a time-resolved measurement of current flow. It should be noted that not all of the magnetometers in magnetometer array 102 are needed to determine current flow in cable 114. Nor do the current/power measurements need to be performed continuously. As a result, many of magnetometers MG can be turned off for much of the time during measurement of current flow in a cable. Furthermore, measurements can be conducted in a low-duty-cycle pulsed manner, thereby realizing significant energy savings. In some cases, the power consumption of probe 100 can be reduced sufficiently to enable energy-harvesting methods to power the probe. In other cases, the energy savings can be utilized to improve battery life—potentially to as long as many years, even when connected to a wireless home automation network.

Typically, since most distribution systems use a fixed amplitude, sinusoidal voltage signal, the RMS voltage, $V_{rms}$, is typically known a-priori. For example, in North America, this value is $120V_{rms}$ for most households, while in Europe, it is 240 $V_{rms}$.

In some cases, however, it is desirable to have a more accurate value for the RMS voltage; therefore, $V_{rms}$ is determined via a time-resolved measurement of the electric field surrounding cable 114 using sensor 106, as discussed below.

Once the values of RMS current and voltage are known, Apparent power, $P_a$, is calculated as: $P_a=I_{rms}V_{rms}$.

As will be apparent to one skilled in the art, however, most users are directly billed for electricity usage based on the Real power, P, rather than Apparent power $P_a$. Real power is the net amount of energy per unit time delivered to a device and directly related to the amount of energy required to generate that electricity. The distinction between these two measures of power arises from the fact that in AC power distribution systems, the voltage and current can be phase shifted, causing voltage and current to be opposite in polarity during different portions of a single period of the AC waveform. For example, this can commonly occur with electrical devices containing inductive loads (such as electrical motors) or capacitive loads (such as computer power supplies), where the phase between voltage and current are shifted from each other.

A probe in accordance the present disclosure, however, enables determination of one or both of Apparent power and Real power, thereby providing significant advantages over the prior art.

At optional operation 207, the Real power delivered by cable 114 is determined.

Unlike Apparent power, determining the Real power delivered by cable 114 requires simultaneous knowledge of the applied voltage and the current at every time t. While the shape and amplitude of V(t) is known in advance (e.g. 60 Hz sine wave with 120 $V_{rms}$ in North America, 50 Hz sine wave with 240 $V_{rms}$ in Europe), the phase of V(t) with respect to I(t) must also be determined.

The phase of the AC current in wires W1 through W3 can be obtained from the time-resolved measurement of current flow performed during optional operation 206, as described above.

The phase of the voltage signal applied between wires of cable 114 is determined by sensing the electric field associated with the applied voltage over measurement period T via sensor 106. It should be noted that identifying the phase instead of directly using the electric field over time can improve performance in the presence of noise in the raw signal. Furthermore, in some cases, to determine the correct polarity, it is necessary to use the location information L1 through L3 to determine which wire is being most directly sensed by an electrode.

In some embodiments, such as when cable 114 is unshielded, sensor 106 can include one or more electrodes located near, or disposed on, the outer surface of cable 114. In some such embodiments, one of these electrodes can be used as a ground reference. In some embodiments, the sensor comprises an electrode that wraps around cable 114 that functions as a ground reference. In some embodiments, shielding is added outside of the electrodes to mitigate external interference.

In such embodiments, amplitude measurements on the plurality of electrodes can be used to electrostatically "image" the wires within a cable, thereby providing augmentation of the location-finding approach described above. Furthermore, this map of electrostatic measurements can be used to better identify the polarity of the voltage applied to each wire.

Figure 5:
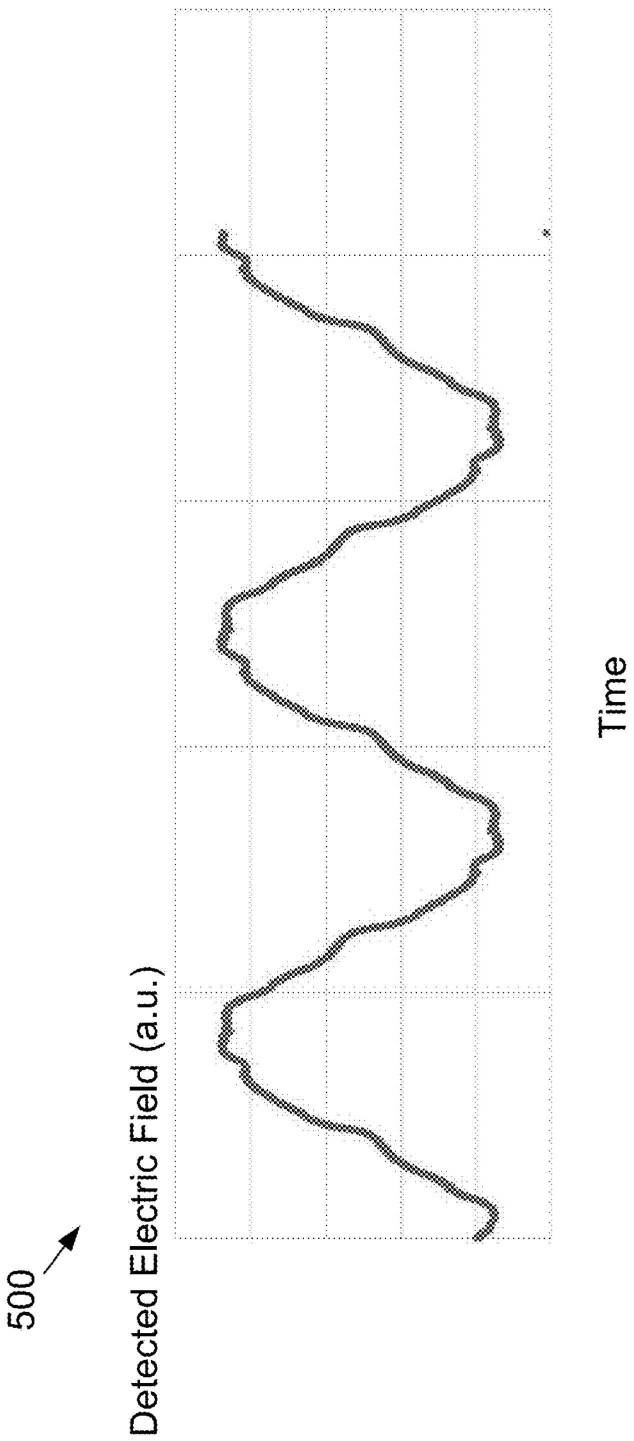
FIG. 5 depicts an exemplary electric field measurement in accordance with the present disclosure.

FIG. 5 depicts an exemplary electric field measurement in accordance with the present disclosure.

Plot 500 shows a measured 60 Hz ripple in the electric field around cable 114, which can be readily detected via sensor 106.

Once the phases of the current flow and voltage signal are known, the Real power delivered by cable 114 is calculated as:

$$P = \frac{1}{T}\int_0^T I(t)V(t)dt. \tag{2}$$

It should be understood to one skilled in the art that the mathematical calculation for real power, as described in equation (2), can be accomplished using any of myriad known methods based on the measurement of electric field over time and current over time. For example, the electric field signal can be rescaled to the expected amplitude of the voltage signal (e.g. 120 $V_{rms}$) and multiplied with current at each time t, and then summed over the measurement interval, bypassing a phase measurement altogether.

The combination of wireless magnetic and electric field sensing in a single compact device can allow for some novel applications for measuring apparent and real power delivered through even for a single wire, such as is the case with a single conductor on a high voltage power line.

At optional operation 208, a power factor for the power delivered by cable 114 is determined. Power factor (pf) is defined as the ratio between real power (P) and apparent power ($P_a$): pf=P/$P_a$ At optional operation 209, the magnitude of the reactive power Q is determined based on the power factor (pf) and real power (P), as given by:

$$|Q| = P\tan(\arccos(pf)).$$

It is to be understood that the disclosure teaches just some examples of embodiments in accordance with the present disclosure and that many variations of the invention can easily be devised by those skilled in the art after reading this disclosure and that the scope of the present invention is to be determined by the following claims.

What is claimed is:

1. A probe (100) for measuring at least one of electric current and power delivered by a cable (114) that includes a plurality of wires (W1 to W3), the probe comprising:

a magnetometer array (102) disposed on a panel, the magnetometer array comprising a plurality of magnetometers (MG-1 to MG-10), each magnetometer of the plurality thereof having a frequency response that is equal to or greater than 100 Hz; and the panel (108), wherein the panel includes a port (116) configured to locate the cable relative to the magnetometer array;

wherein the magnetometer array is arranged about the port such that, when the probe and cable are operatively coupled via the port, the magnetometer array partially surrounds the cable; and wherein each magnetometer of the plurality thereof is configured to provide an output signal (112-1 to 112-10) to a processor (110), the output signal being indicative of the magnetic field strength at its respective magnetometer and being used to generate a magnetic field map that is deconvolved to identify a location of each of the wires to thereby determine a current in each of wires using the location of, and the magnetic field strength at, each respective magnetometer.

2. The probe of claim 1 wherein each magnetometer of the plurality thereof (MG-1 through MG-10) occupies an area on the panel (108) that is less than or equal to four square millimeters.

3. The probe of claim 1 wherein a first wire (W1) of the plurality thereof (W1-W3) conducts a first electric current having maximum frequency-of-interest, and wherein at least one magnetometer of the plurality thereof (MG-1 through MG-10) has a frequency response that is equal to or greater than twice the maximum frequency-of-interest.

4. The probe of claim 1 wherein the port (116) is configured to secure the cable (114) in a substantially immovable position relative to the magnetometer array (102).

5. The probe of claim 1 further comprising the processor (110), the processor being configured to identify the location (L1) of at least one wire (W1) of the plurality thereof (W1-W3) based on the plurality of output signals (112).

6. The probe of claim 5 wherein the processor is further configured to measure a current flow in a first wire (W1) of the plurality of wires (W1-W3).

7. The probe of claim 6 wherein the probe further includes a sensor (106) that is operative for measuring an electric field (500) corresponding to a voltage signal applied to cable (114), and wherein the processor (110) is further configured to determine at least one of a real power and an apparent power based on the current flow and the electric field.

8. A method for measuring at least one of electric current and power delivered by a cable (114) that includes a plurality of wires (W1 to W3), the method comprising:

operatively coupling a probe (100) and the cable, wherein the probe includes a magnetometer array (102) disposed on a panel (108), the magnetometer array comprising a plurality of magnetometers (MG-1 through MG-10) characterized by a frequency response that is equal to or greater than 100 Hz, and wherein probe and cable are arranged such that the magnetometer array partially surrounds the cable;

providing an output signal (112-1 to 112-10) from each magnetometer of the plurality thereof to a processor (110), wherein the output signal of each magnetometer is indicative of the magnetic field strength at that magnetometer;

creating a magnetic-field map (400) based on the plurality of output signals;

identifying the location (L1) of at least one wire (W1) of the plurality thereof (W1-W3) based on the magnetic-field map; and deconvolve the magnetic field map to identify a location of each of the wires to thereby determine a current in each of wires using the location of, and the magnetic field strength at, each respective magnetometer.

9. The method of claim 8 further comprising providing the probe (100) such that each magnetometer of the plurality thereof (MG-1 through MG-10) occupies an area on the panel (108) that is less than or equal to one square millimeter.

10. The method of claim 8 further comprising providing the probe (100) such that each magnetometer of the plurality thereof (MG-1-MG-10) is characterized by a frequency response that is equal to or greater than twice the maximum frequency-of-interest of a first current flowing in a first wire of the plurality thereof.

11. The method of claim 8 further comprising securing the cable (114) to the probe (100) such that the cable is substantially immovable relative to the magnetometer array (102).

12. The method of claim 8 further comprising identifying the location (L1-L3) of at least one wire of the plurality thereof (W1-W3) based on the plurality of output signals (112).

13. The method of claim 8 further comprising measuring a current flow in the cable (114), wherein at least one magnetometer of the plurality thereof (MG-1 through MG-10) is unpowered while the current flow is measured.

14. The method of claim 13 further comprising:

measuring an electric field (500) corresponding to a voltage signal applied to the cable (114); and determining at least one of a real power and an apparent power based on the current flow and the electric field.

15. The method of claim 8 wherein the location of the at least one wire of the plurality thereof (W1-W3) is identified via deconvolution of the magnetic-field map (400).

* * * * *